United States Patent
Zhao et al.

(10) Patent No.: US 8,139,030 B2
(45) Date of Patent: *Mar. 20, 2012

(54) MAGNETIC SENSOR FOR USE WITH HAND-HELD DEVICES

(75) Inventors: Yang Zhao, Andover, MA (US); Pan Guozhi, Shenzhen (CN); Yu Jianping, Shanghai (CN); Haidong Liu, Jiangsu (CN)

(73) Assignee: Memsic, Inc., Andover, MA (US)

( * ) Notice: Subject to any disclaimer, the term of this patent is extended or adjusted under 35 U.S.C. 154(b) by 22 days.

This patent is subject to a terminal disclaimer.

(21) Appl. No.: 12/704,896

(22) Filed: Feb. 12, 2010

(65) Prior Publication Data

US 2010/0161084 A1   Jun. 24, 2010

Related U.S. Application Data

(63) Continuation-in-part of application No. 11/487,108, filed on Jul. 14, 2006, now Pat. No. 7,667,686.

(60) Provisional application No. 60/764,022, filed on Feb. 1, 2006.

(51) Int. Cl.
*G09G 5/08* (2006.01)

(52) U.S. Cl. ........ 345/158; 345/156; 345/157; 345/159; 345/160; 345/161; 345/162

(58) Field of Classification Search .......... 345/156–162
See application file for complete search history.

(56) References Cited

U.S. PATENT DOCUMENTS

| | | | |
|---|---|---|---|
| 5,583,543 A | 12/1996 | Takahashi et al. | |
| 5,796,866 A | 8/1998 | Sakurai et al. | |
| 5,864,635 A | 1/1999 | Zetts et al. | |
| 6,147,678 A | 11/2000 | Kumar et al. | |
| 6,249,606 B1 | 6/2001 | Kiraly et al. | |
| 6,466,198 B1 * | 10/2002 | Feinstein | 345/158 |
| 7,000,200 B1 | 2/2006 | Martins | |
| 7,044,913 B2 | 5/2006 | Shiki | |
| 7,421,900 B2 | 9/2008 | Karasawa et al. | |
| 7,563,230 B2 | 7/2009 | Nakaya | |
| 7,580,553 B2 | 8/2009 | Kamiyama et al. | |
| 2004/0070564 A1 * | 4/2004 | Dawson et al. | 345/156 |
| 2004/0259591 A1 | 12/2004 | Grams et al. | |
| 2005/0210419 A1 | 9/2005 | Kela et al. | |
| 2005/0248587 A1 | 11/2005 | Kamiyama et al. | |

FOREIGN PATENT DOCUMENTS

WO   WO 03/001340   1/2003

* cited by examiner

*Primary Examiner* — Richard Hjerpe
*Assistant Examiner* — Saifeldin Elnafia
(74) *Attorney, Agent, or Firm* — Weingarten, Schurgin, Gagnebin & Lebovici LLP (57) ABSTRACT

The use of magnetic field sensing to perform sophisticated command control and data input into a portable device is disclosed. A magnetic field sensor is embedded or fixedly attached to a portable device to measure changes in the magnetic field strength and/or direction accompanying movement, motion or tilt of the device in one-, two- or three-dimensions when the portable device is used to air-write or make gestures.

10 Claims, 8 Drawing Sheets

PRIOR ART

MAGNETIC SENSOR FOR USE WITH HAND-HELD DEVICES

CROSS REFERENCE TO RELATED APPLICATIONS

This application in a continuation-in-part of U.S. patent application Ser. No. 11/487,108 filed on Jul. 14, 2006 and claims the benefit of provisional patent application No. 60/764,022 filed on Feb. 1, 2006.

STATEMENT REGARDING FEDERALLY SPONSORED RESEARCH OR DEVELOPMENT

N/A

BACKGROUND OF THE INVENTION

1. Field of the Invention

The present invention discloses using changes in a magnetic field to perform sophisticated command control and data input into a portable device and, more particularly, using magnetic sensors in hand-held devices to detect changes in a magnetic field that accompany deliberate motion or movement of the devices.

2. Summary of the Related Art

Portable devices and especially, although not exclusively, portable wireless devices, e.g., mobile phones, cordless phones, text messaging device, pagers, talk radios, portable navigation systems, portable music players, portable video players, portable multimedia devices, personal digital assistants (PDAs), portable games, and the like, are used in everyday day life. Conventionally, user command input and data input into portable devices have been performed using an input device such as a keyboard entry, button pressing or handwriting using a stylus or digital pen. As portable devices become more sophisticated, traditional button or handwriting entry may be insufficient to command or input information into the device efficiently or, disadvantageously, the data are too cumbersome to do so quickly.

The development of motion sensors, e.g., motion sensing accelerometers, moving the portable device itself can be used to command the portable device and/or input data as easily as inputting information into the device conventionally. For example, U.S. Pat. No. 5,864,635 to Zetts, et al. discloses methods and systems for detecting a set of strokes input by a stylus and categorizing the strokes as either a gesture or handwriting. U.S. Pat. No. 5,583,543 to Takahashi, et al. discloses a processing device with a gesture command judging section. The gesture command judging section recognizes a gesture command using trace coordinates of a line drawing. Data are input using the positional relationship between a pen and a screen. U.S. Pat. No. 6,249,606 to Kiraly, et al. discloses methods and systems for gesture recognition in which a cursor directing device, e.g., a mouse, is used to track and record gestures.

These systems, however, require an additional portable element for command control data input. Moreover, the motion sensing elements of these devices only rely on the relative movement of the stylus, pen, mouse, and the like.

Therefore, it would be desirable to provide methods, devices, and systems for command control and data input using the portable device itself. Furthermore, it would be desirable to provide methods, devices, and systems for command control and data input that use not only the motion or movement of the portable device but, that, moreover, are adapted to sense changes in at least one of the strength and the direction of a magnetic field that accompany deliberate motion or movement of the portable device, to provide the command control and data input.

BRIEF SUMMARY OF THE INVENTION

A motion- and magnetic field-sensing device for initiating a control command to a portable device and/or for inputting data into a portable device, e.g., a wireless device, a mobile telephone, a cordless telephone, a text-messaging device, a digital pager, a talk radio, a portable navigation system, a portable music player, a portable video player, a portable multimedia device, personal digital assistant (PDA), and a portable game, is disclosed. The motion- and magnetic-field sensing device, e.g., at least one magnetic sensor, is fixedly attached to or embedded in the portable device and, moreover, is structured and arranged to sense or to detect changes in at least one of a magnetic field strength and a magnetic field direction resulting from one-, two- or three-axes of motion or movement of the portable device, e.g., from air-writing or gesturing.

A system for controlling a portable device using motion and magnetic field sensing or for inputting data into a portable device is also disclosed. The system includes a motion- and magnetic-field sensing device that senses or detects changes in at least one of the magnetic field strength and the direction of a magnetic field resulting from motion or movement of the portable device in as many as three axes, a magnitude or amount of movement of the portable device; a data acquisition unit that receives motion and magnetic field data signals transmitted from the motion- and magnetic-field sensing device; memory for storing pre-determined motion and magnetic field data; and a control unit.

The control unit analyzes filtered signals transmitted from the data acquisition unit; identifies characteristics of the changes in at least one of the magnetic field strength and the direction of a magnetic field resulting from motion or movement of the device; compares the characteristics of the changes in magnetic field strength and/or in the direction of a magnetic field with pre-determined correlation data between discrete output commands and input operations and changes in magnetic field strength and/or changes in direction of a magnetic field stored in memory; and automatically executes an appropriate output command or input operation associated with the pre-determined correlation when the characteristics of the motion-induced changes in magnetic field strength and/or in direction of a magnetic field of the filtered signals match the pre-determined correlation data. The data acquisition unit further includes a filtering portion that filters a desired signal comprising changes in magnetic field strength and/or changes in direction of a magnetic field characteristics from the data signals.

A method for controlling a portable device and for inputting data into a portable device using at least one of changes in magnetic field strength and/or in direction of a magnetic field resulting from motion or movement of the portable device are also disclosed. Each method includes installing or embedding a magnetic field-sensing device in the portable device; providing a plurality of pre-determined correlations between changes in magnetic field strength and/or changes in direction of a magnetic field resulting from motion or movement that are each uniquely associated with a discrete control operation; detecting changes in magnetic field strength and/or changes in direction of a magnetic field resulting from motion or movement of the portable device with the magnetic field-sensing device; comparing the changes in magnetic field strength and/or the changes in direction of a magnetic field resulting from motion or movement so detected with the plurality of pre-determined correlations; and initiating the discrete control operation or data input that is associated with the correlations.

BRIEF DESCRIPTION OF THE SEVERAL VIEWS OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

Furthermore, the invention will be more fully understood by referring to the Detailed Description of the Invention in conjunction with the Drawings, of which.

DETAILED DESCRIPTION OF THE INVENTION

U.S. patent application Ser. No. 11/487,108 filed on Jul. 14, 2006 and provisional patent application No. 60/764,022 filed on Feb. 1, 2006 are incorporated herein in their entirety.

Figure 1:
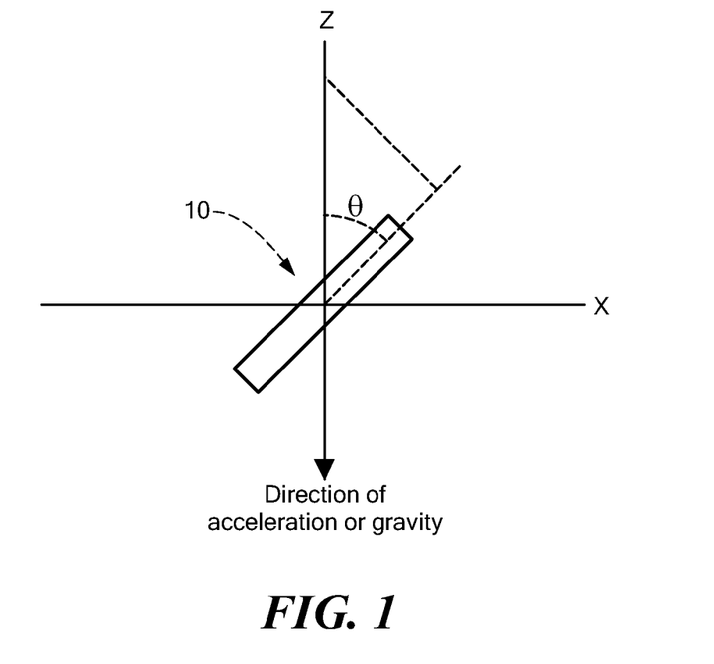
FIG. 1 shows an illustration of an accelerometer detecting acceleration or acceleration due to gravity in accordance with the prior art.

Motion-sensing devices or motion sensors, e.g., accelerometers, strain gauges, piezo-electric devices, piezo-resistive devices, capacitive devices, mechanical switches, ball-and-tube devices, gyroscopes, compasses, magnetic devices, optical devices, infrared devices, and the like, are well-known to the art as means for detecting motion in an object to which they are fixedly attached. As shown in FIG. 1, motion-sensing devices can detect one-, two-, or three-axes of movement by measuring the acceleration of a moving object 10 in each axis with respect to time, from which velocity and distance relationships can be derived, e.g., through mathematical integration.

For example, by measuring the force of gravity—a special type of acceleration—applied to an object 10, one can derive the orientation and angle ($\theta$) of an object 10 relative to the direction of acceleration. Accordingly, accelerometers can be used to detect not only acceleration (including acceleration due to gravity), velocity, and distance, but, also, tilt, inclination, freefall, shock, and vibration. Although this invention will be described using an accelerometer as the motion-sensing device, the invention is not to be construed or limited thereto.

Knowing that all motion or movement, e.g., from air-writing, hand gestures, and the like, has unique acceleration, velocity, and positional data characteristics associated with it, the signal response of a user-defined input, such as motion from air-writing or a hand gesture, can be compared with a database of signal responses. The results of that comparison can then be used to initiate or trigger a command to or function for the portable device.

Changes in motion or movement, e.g., from air-writing, hand gestures, and the like, also have magnetic field characteristics associated with them. Hence, a change in a signal response associated with at least one of a magnetic field strength and a direction of a magnetic field resulting from a user-defined input such as motion from air-writing or a hand gesture can be compared with a database of such signal responses. The results of that comparison can then be used to initiate or trigger a command to or function for the portable device.

Although the prior art describes wireless devices that can be controlled by tilting or otherwise moving the device by simple motion, e.g., to advance to the next selection of a menu, to scroll through a menu at a constant rate, and the like, the invention as claimed controls wireless and non-wireless, i.e., hardwired, portable devices according to the amount or magnitude of the motion or movement as well as the rate of change of the motion or movement, e.g., the rate of change of tilt angle, and the like. Indeed, the portable device is controlled not only by detecting motion or movement but, also, by measuring the amount or magnitude of motion or movement of the portable device and by measuring the rate of change of the motion or movement. Hence, the rate of change and the magnitude of movement also are used to control data input and to control execution of functions.

Although prior art may describe simple motion detection, this embodiment describes the use of full motion information such as rate of change to perform functions and commands. Without rate input, portable device motion sensing would be limited to a few simple gestures. In addition, this embodiment demonstrates the use of air-writing to input search criteria and filter schemes for portable devices to manage, search, and sort through various data, files, and information.

Figure 2:
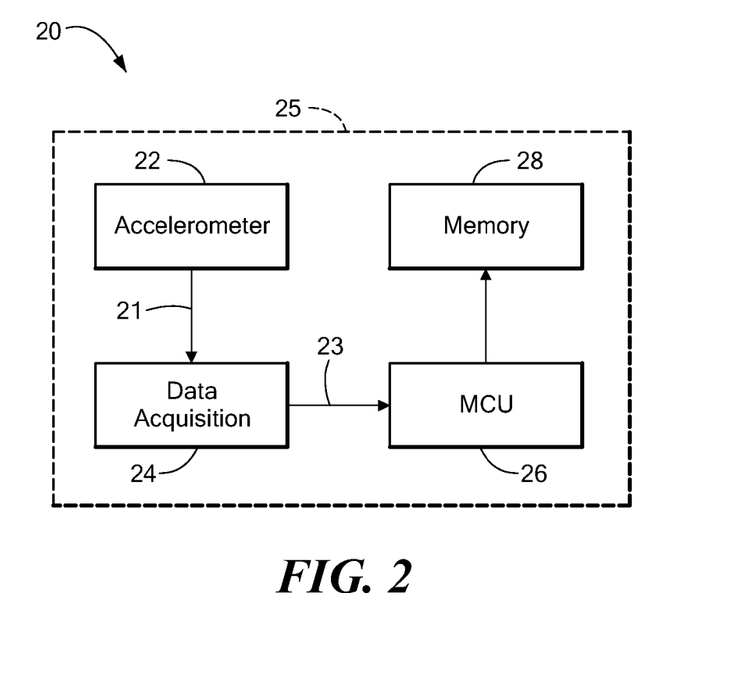
FIG. 2 shows a block diagram of a device for controlling data input and/or command functions using a portable device in accordance with the present invention.

FIG. 2 is a block diagram of a system 20 for controlling a portable device 25 by sensing the magnitude of the motion or movement and, more particularly, by sensing the rate of change of motion of the device. The system 20 includes a motion sensing device 22, a data acquisition device 24, a controller 26, e.g., a micro-control unit (CONTROLLER), and memory 28. Memory 28 provides temporary and permanent data storage, e.g., for pre-determined motions, movements or gestures, storage for applications or driver programs, temporary space for executing an application or driver program, and the like. Memory 28 can be one or more of random access memory (RAM), cache memory, read-only memory (ROM), flash memory, and the like.

The accelerometer 22 is fixedly attached to or embedded in so as to be in operational association with the hand-held, portable device 25. As a result, any motion or movement of the portable device 25 results in identical movement, e.g., having the same magnitude and rate of change of movement or motion, of the accelerometer 22. The accelerometer 22 senses motion or movement of the portable device 25, providing analog or digital signal data 21 of that motion or movement to the data acquisition unit 24.

In one aspect of the present invention, the accelerometer 22 is structured and arranged to not only detect and record a magnitude of motion or movement and a direction of motion or movement, but, more preferably, to detect and record the rate of change of motion or movement, e.g., whether the portable device 25 is being rotated slowly or rapidly, whether the portable device 25 is being tilted slowly or rapidly, and the like.

The data acquisition unit 24 (DAU) acquires the signal data 21 transmitted from the motion-sensing device 22, converting analog signals to digitals signals or digital signals to analog signals or merely passing the signal data 21 in its original form through the DAU 24 to the controller 26 without changing the data signals 21 from analog to digital or from digital to analog. The DAU 24 includes a filtering portion, e.g., a low-pass filter, to filter the desired signal data 23, comprising motion characteristics, from the data signals 21. The DAU 24 provides these filtered data 23 to the controller 26. The controller 26 analyzes the filtered accelerometer data 23 from the DAU 24 and identifies the characteristics of the motion.

The controller 26 then compares the characteristics of the motion signal to pre-determined motion data that are stored in memory 28, e.g., in a look-up table of gestures or air-writing motions. If the comparison does not produce a match, motion or movement data 21 are again read by the motion-sensing device 22 and the process repeats. However, if the motion signal characteristics match, an appropriate output command to the portable device 25 is automatically generated and transmitted.

Figure 3A:
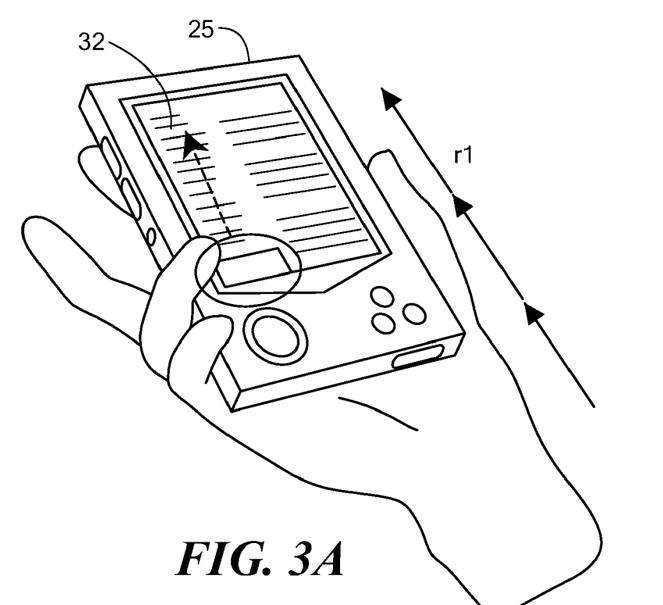
FIG. 3A shows a portable device oriented to provide a first text scrolling rate in accordance with the present invention.
Figure 3B:
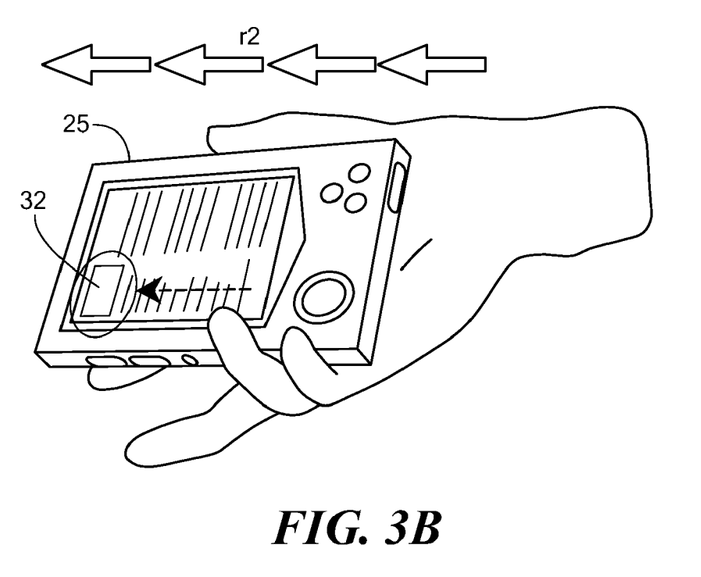
FIG. 3B shows a portable device oriented to provide a second text scrolling rate in accordance with the present invention.

Further disclosure of the invention will be provided by examples of its capabilities. For example, if a user is reading text on the display 32 of a portable device 25 and wishes to scroll through that portion of the text that does not fit on the display screen 32, the rate of change in the tilt angle or the amount or magnitude of the tilt angle can increase or decrease the scroll rate of the text across the display 32. Indeed, FIG. 3A shows a user holding a PDA 25 in a generally upright orientation, which allows the user to read text that is scrolling at a first rate r1. By tilting the PDA 25 forward, as shown in FIG. 3B, the rate of text scrolling increases to a second rate r2, which is faster than the first rate r1. Alternatively, the scrolling rate of the text can be increased by tilting the PDA 25 more quickly (or more slowly) rather than controlling by the actual tilt angle itself. The described example would also, conversely, apply for decreasing the scroll rate.

The portable device 25 can also be moved or tilted to perform various command functions. These functions or commands can vary, depending on the application, e.g., electronic mail, Internet, telephone call, text messaging, and the like, as well as can vary depending on the type of portable device 25 being used, e.g., a mobile telephone, an MP3 player, and the like.

Figure 4A:
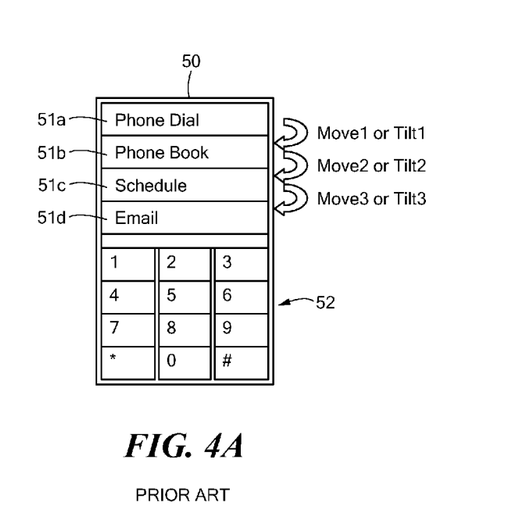
FIG. 4A shows a schematic of one method of scrolling or navigating about a portable device such as, but not limited to, a mobile telephone in accordance with the prior art.

FIG. 4A shows a schematic of a portable device, e.g., a mobile telephone 50, with four menu items 51a-51d and a dialing pad 52. According to the prior art, a user must tilt or otherwise move the mobile telephone 50 to select a desired menu item, e.g., Phone Dial 51a, and move or tilt the mobile telephone 50 again to select the next menu item, e.g., Phone Book 51b, and so forth. Consequently, the user would have to initiate three distinct or separate movements, gestures or tilts to menu scroll from the "Phone Dial" 51a to the "Email" 51d option.

Figure 4B:
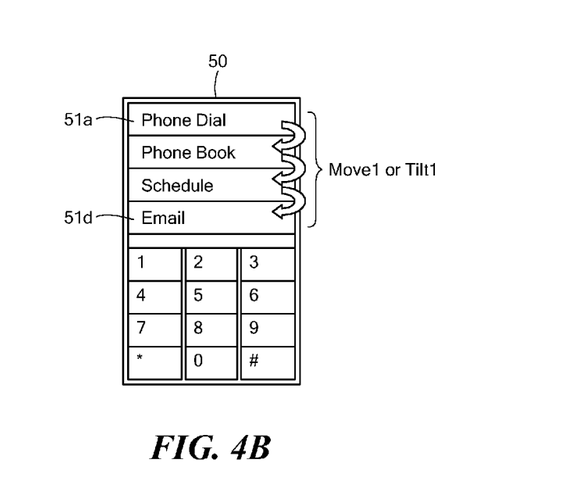
FIG. 4B shows a schematic of another method scrolling or navigating about a portable device such as, but not limited to, a mobile telephone in accordance with the present invention.

In contrast, according to one aspect of the present invention, the tilt or, more particularly, the rate of change of tilt can be used to scroll faster or slower from one menu item to the other menu items, without having to make multiple motion gestures. Hence, a single movement or tilt at a particular rate or magnitude can be used to scroll continuously from "Phone Dial" 51a to "Email" 51d as shown in FIG. 4B. Such motion sensing can be used for all commands and item selections on a portable device 25.

In another aspect of the present invention, the system 20 also enables portable devices 25 to be moved relative to stored text or stored image data, i.e., to pan the portable device 25 or, more particularly, to pan the portable device's display screen 32 across text or across a display image that is too large for the display screen 32. This feature allows users to move the portable device 25 to navigate a "virtual window" to various areas of the text or image data stored in the portable device 25. Hence, motion sensing can be used to navigate within a particular image, document, spreadsheet, text, or other type of file.

Figure 5:
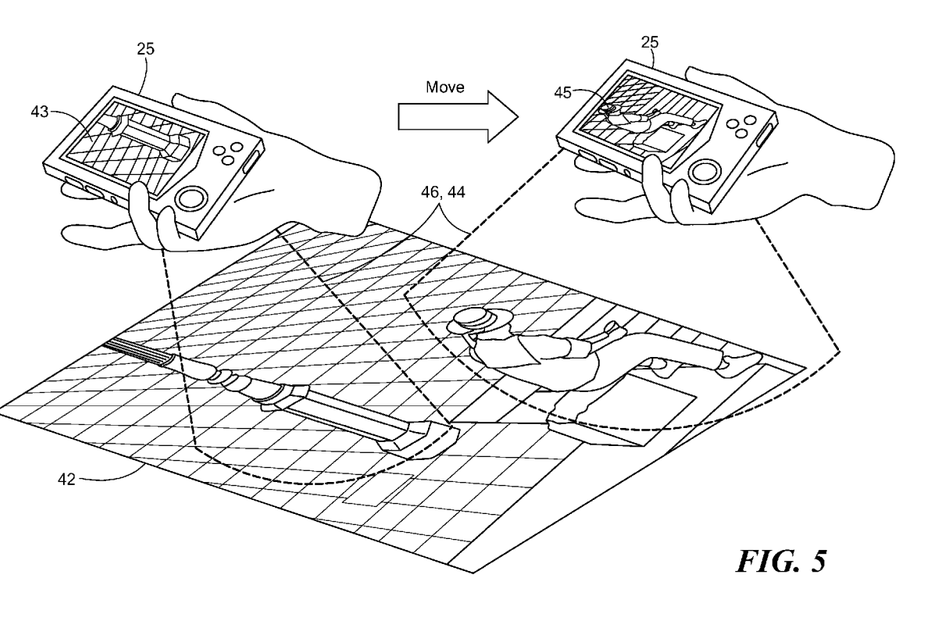
FIG. 5 shows a portable device being used to pan across a digital image that is too large for the display screen in accordance with the present invention.

Referring to FIG. 5, this feature is convenient for navigating about a stored electronic image, e.g., a digital photograph, that is too large to be displayed in its entirety on the display 32 of the portable device 25. In a first orientation, the display screen 32 can display a first image 43 of a first view area 44 of the image 42. Moving the portable device 25 in one-, two- or three-dimensions to a second orientation, the display screen 32 displays a second image 45 of a second view area 46 of the same image 42.

Motion gesturing can be combined with the above feature to initiate other functions or features, e.g., zooming-in, zooming-out, copying, cutting, pasting, and the like, within a particular application. For example, the portable device 25 can be structured and arranged to function as an external input device, e.g., as a mouse, to perform, for example, "drag-and-drop"-type operations.

Figure 6:
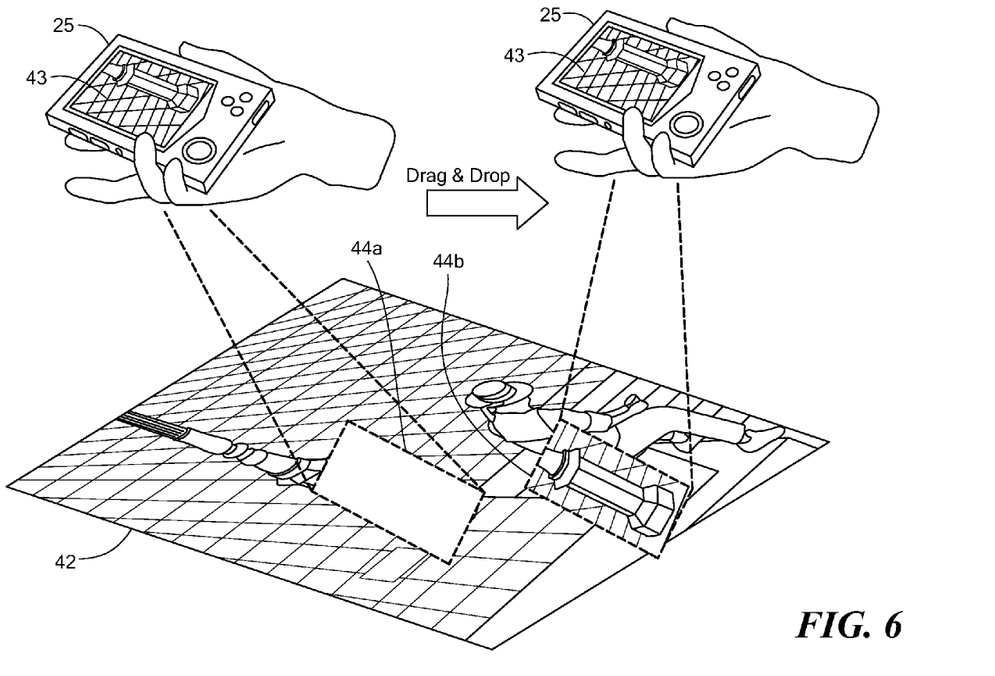
FIG. 6 shows a portable device being used as a mouse to "drag-and-drop" a first view area of a digital image to a second view area on the same digital image in accordance with the present invention.

Referring to FIG. 6, the use of a portable device 25 to perform a "drag-and-drop" operation in accordance with the present invention is shown. As previously described, by moving the portable device 25 in one-, two- or three-dimensions, the user can pan from a first image 43 of a first view area 44 to a second image 45 of a second view area 46. However, after executing a pre-designated gesture using the portable device 25, the device 25 can be used as an external device such as a mouse.

In this mode, rather than viewing two different view areas 44 and 46 of an image 42, the pre-designated gesture allows users to select a first view area 44a, and to "drag-and-drop" or "cut-and-paste" the image 43 at a second view area 44b of the same image 42.

In one application, since accelerometers 22 detect motion or movement, a desired function or application can be executed automatically as soon as a pre-determined or particular motion or gesture is detected. For instance, if a mobile or cellular telephone rings, the moment a user picks up the mobile or cellular telephone and holds it to his or her ear, the accelerometer 22 can detect the pre-determined or particular motion associated with answering a call. As a result, the controller 26 can automatically connect the caller without the user having to activate a SEND button or the like.

Conversely, the accelerometer 22 can also be structured and arranged to detect the absence or lack of motion after a mobile or cellular telephone rings. For example, if a mobile or cellular telephone is ON and rings but the accelerometer 22 does not detect or record any acceleration signal data, the controller 26 can, instead, initiate or trigger an audible or visual signal to notify or alert the user of the call. Optionally, the controller 26 can, then, disconnect from the caller, power down, and/or enter a standby mode to conserve battery power. Such concepts apply to all portable devices 25 in which the portable device 25 "wakes up", "shuts down", or enters "standby" mode as a result of detection of a call and/or human motion or a lack thereof. This feature is especially convenient for cordless telephones in which the telephone is turned-on or turned-off depending on the motion or movement detected or not detected, regardless of whether or not the cordless telephone is replaced in the base station cradle.

In yet another application, an accelerometer 22 can be disposed in a head-mounted device (not shown) such as a head-mounted video camera, display, earphone, microphone, and the like. A head-mounted device can be used to detect various motions or movements of the user's head, which can be used to initiate a command or action. For instance, an earphone connected wirelessly to a portable device 25 can be structured and arranged to detect a predefined or pre-determined motion, e.g., to turn-on or turn-off a portable device, to answer a telephone call, to increase or decrease volume, and the like. The device 20 can also be structured and arranged so that the user's head movements can, e.g., scroll through a menu, pan or navigate about an image or control or program an instrument that is controlled by the head-mounted device.

In still another application, motion or gesture sensing can be used to input alphanumeric characters into a portable device 25 automatically. For example, by writing alphanumeric characters in the air, i.e., by "air-writing", using the portable device 25, the controller 26 be structured and arranged to identify the character that has been written, e.g., by comparing the air-written character with calibrated gestures or writings stored in memory 28.

Figure 7:
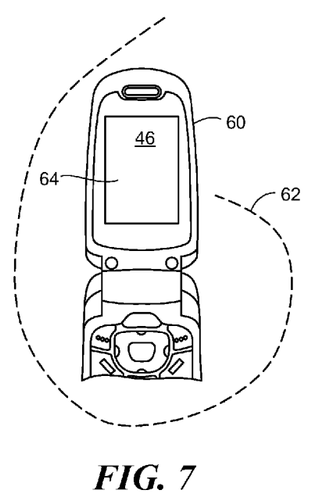
FIG. 7 shows a portable device being used to air-write an alphanumerical character in accordance with the present invention.

Referring to FIG. 7, there is shown a hand-held telephone 60 that has been moved to air-write the number "6" 62. The accelerometer 22 transmits motion data signals 21 to the controller 26 via the data acquisition unit 24. Once the controller 26 matches the filtered accelerometer data signals 23 with the appropriate motion, movement or gesture character stored in memory 28, the controller 26 displays the number "6" on the display screen 64.

Once the air-written character 62 has been matched to a gesture or writing in memory 28, the controller 26 executes an operation or function consistent with the pre-determined gesture or writing. For example, this feature allows users to dial a mobile telephone by sequentially air-writing the telephone number or by sequentially spelling a person's name that is associated with a telephone number stored in memory 28.

Short-cut air gestures or air-symbol writing can also be used to trigger or initiate a function or operation. For example, an air-written outline of a heart could initiate a telephone call home. Air-writing can also be used to input search criteria or filter schemes. For example, an alphanumeric character can be air-written, e.g., using an MP3 player or a media player, to input the first letter or first few letters of a song or performing artist, to filter or to sort through the data. The user may choose to air-write additional characters to filter or sort through information further. This feature is particularly helpful when thousands of data, contact information, songs, files, videos, and the like, are stored and listed in a portable device such as the Apple® iPod®.

In a second embodiment, the invention as claimed controls wireless and non-wireless, i.e., hardwired, portable devices according to changes in the magnitude and/or changes in the direction of a magnetic field resulting from the deliberate motion or movement of the portable device. Indeed, the portable device can be controlled not only by detecting motion or movement as described in detail hereinabove, but, also, by measuring changes in the magnitude of the magnetic field and/or changes in the direction of the magnetic field of the portable device resulting from the motion or movement of the same. Hence, changes in at least one of the magnitude and/or the direction of a magnetic field can also are used to control data input and to control execution of functions.

Figure 9:
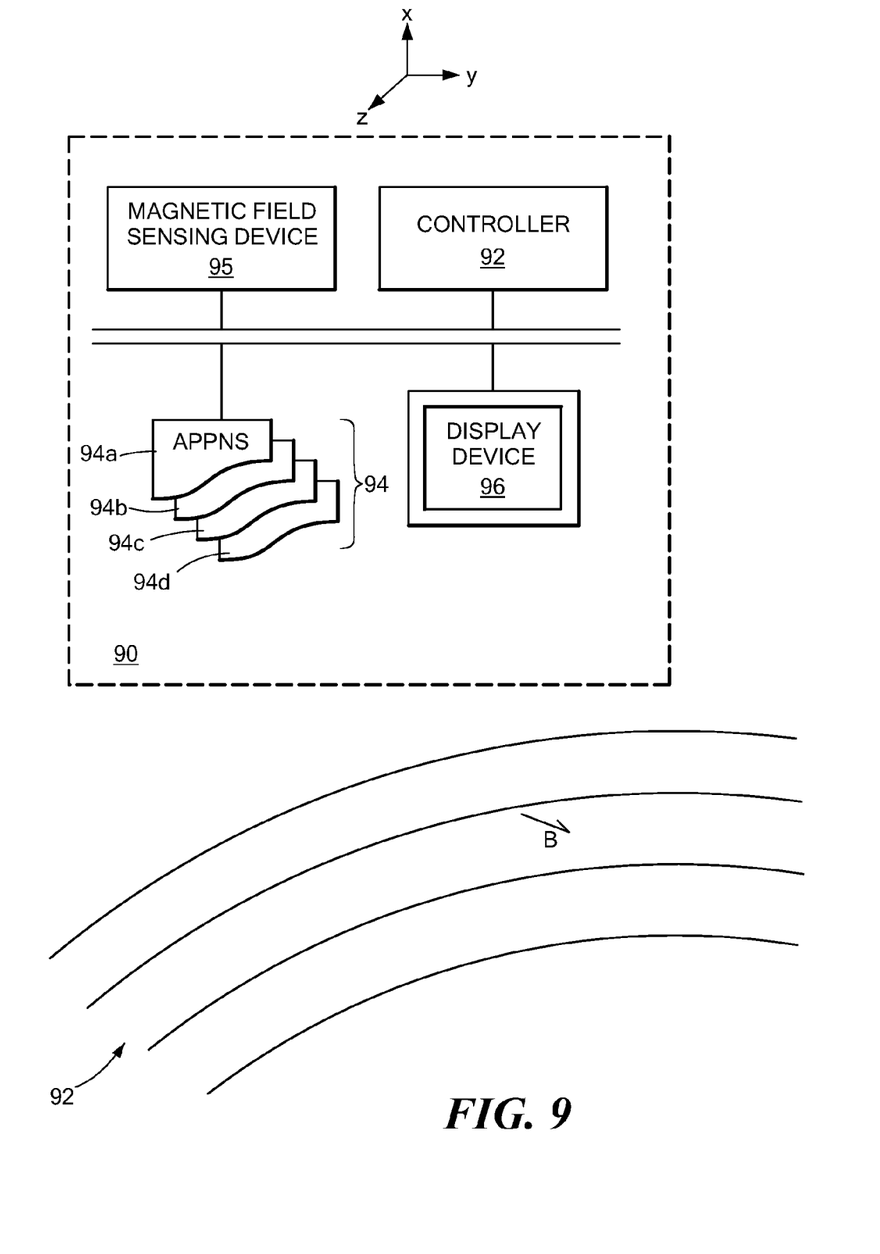
FIG. 9 shows a block diagram of a portable device having a magnetic field-sensing device for use in detecting motion in accordance with the present invention.

Referring to FIG. 9, there is shown a block diagram of a portable device 90 having a magnetic field-sensing device 95 that is adapted to use measurable changes in at least one of a magnetic field strength and a magnetic filed direction that accompany a deliberate movement of the portable device 90 to control the functioning of the portable device 90 and/or for inputting data into the portable device 90.

The magnetic field-sensing device 95 can be structured and arranged to detect slight changes in the Earth's magnetic field 92 due to a shaking motion, a rotation motion, and a flipping motion. Thus, signals of magnetic field strength and/or changes in magnetic field strength resulting from a deliberate motion or movement of the portable device 90 can be sent to a controller 92, which is structured and arranged to control the portable device 90 itself and/or to control an application 94 running on the portable device 90.

For example, a shaking motion can be used to change a current application 94a to a next application 94b, such as to change from one song to the next song in a queue of songs or to change from one image to the next image in a queue of images.

By turning over the hand-held device 90, i.e., flipping the device, the flipping motion can be used to control a sound level in connection with sound-related applications 94c. For example, a flipping motion can be used to mute or, alternatively, to turn on the sound in a sound-related application 94c.

By rotating the hand-held device 90, the rotating motion can be used to control rotation-related application 94d. For example, images or Web site displays, i.e., pages, that are being displayed on a display device 96 that is integrated with the hand-held device 90 or that are being displayed on a display device 96 that is electrically coupled to the hand-held device 90 can be rotated degrees, 180 degrees, and so forth in real time. In a particular application, the hand-held device 90 can be used as a game controller, allowing the gamer to control the orientation of an object, e.g., a steering wheel, a flight control device, etc., displayed on a display device 96. Applying a rotating motion to the hand-held device 90 could also be used to control the positioning, e.g., map up, map down, map left, map right, zoom in, zoom out, of a map on a display device 96.

Figure 8:
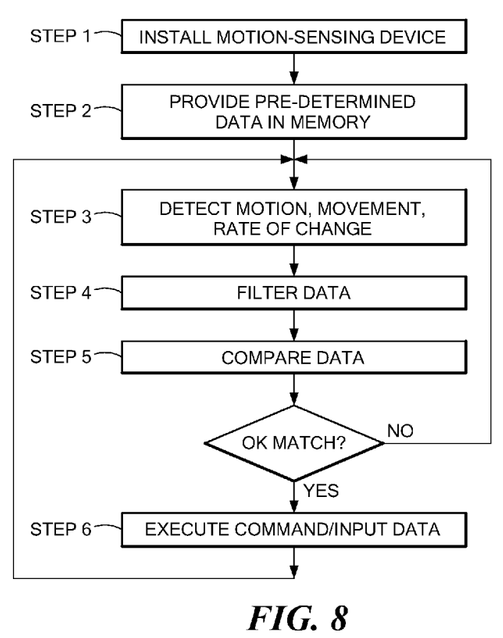
FIG. 8 provides a flow chart of a method of using a portable device to input data or control the device using air-writing.

Having described systems and devices for controlling a portable device using the device itself and/or for inputting data into the portable device using the device itself, a method for controlling the device and/or inputting data into the device using motion or movement of the portable device will now be described. Referring to FIG. 8, in a first step, a motion-sensing device, e.g., an accelerometer and the like, can be installed or embedded in the portable device (STEP 1) in a manner that is well known in the art. In a second step, memory containing a plurality of pre-determined movements, motions or gestures can be provided (STEP 2). In one aspect, each of the plurality of pre-determined movements, motions or gestures can be uniquely associated with a discrete control or input operation, e.g., similar to a pointer. Consequently, when a sensed motion or movement of the portable device has been matched to one of the plurality of pre-determined movements, motions or gestures, the control or input function or operation associated with pre-determined movement, motion or gesture will be executed automatically.

In a next step, the motion-sensing device monitors and detects any motion or movement of the portable device, and, moreover, calculates and records a rate of change of movement or motion of the portable device (STEP 3). These acceleration signal data can then be provided to the controller for comparison with the plurality of pre-determined motions (STEP 5). Optionally, but advantageously, the motion, movement, and rate of change of motion or movement data from the motion-sensing device can be filtered (STEP 4) to remove undesirable noise before comparing the motion, movement, and rate of change of motion to the plurality of pre-determined motions (STEP 5).

If the comparison of motion or movement and the rate of change of motion signal data with the plurality of pre-determined motions stored in memory provides no match, then the motion-sensing device continues to monitor and detect motion or movement of the portable device, and to calculate the rate of change of movement or motion of the portable device (STEP 3). However, if comparison of motion or movement and the rate of change of motion with the plurality of pre-determined motions provides a match, then the controller executes the function, operation, driver program, application, and the like that is associated with the matching pre-determined motion (STEP 6).

Figure 10:
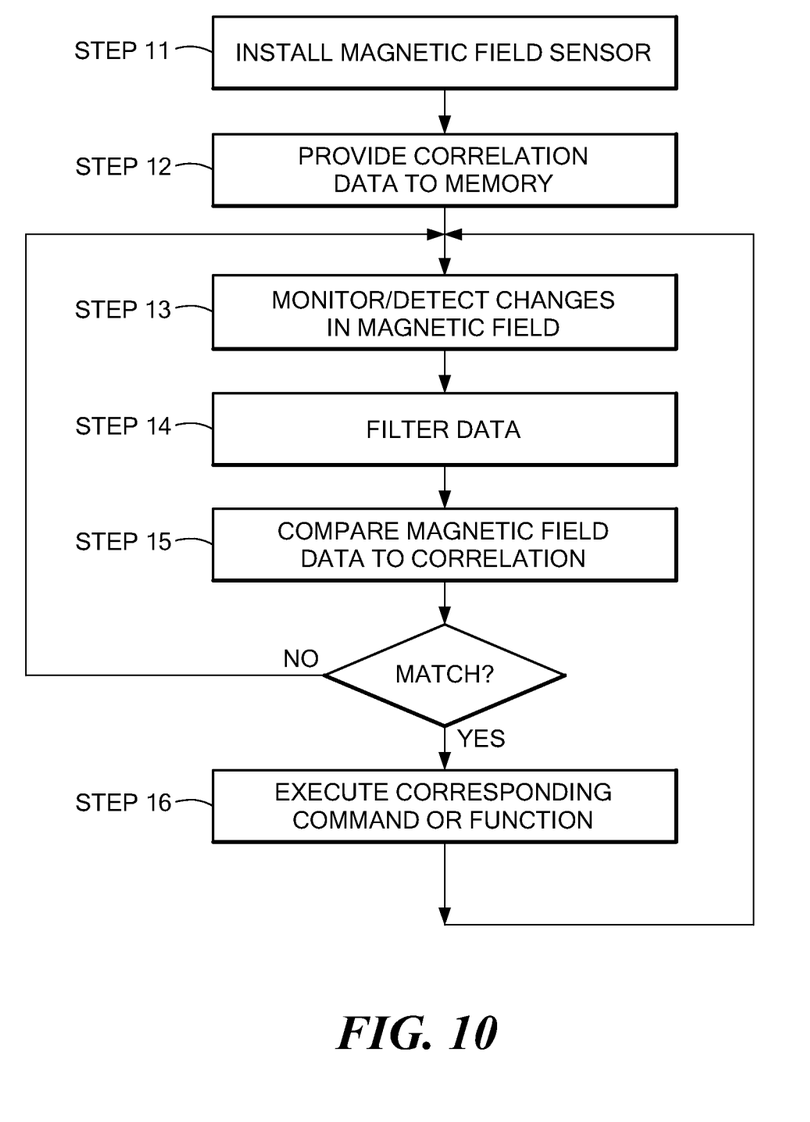
FIG. 10 shows a flow chart of a method of using a portable device having at least one magnetic-field sensing device to input data or control the device using air-writing.

Having described systems and devices for controlling a portable device using the device itself and/or for inputting data into the portable device using the device itself, a method for controlling the device and/or inputting data into the device by detecting changes in at least one of the magnetic field strength and the magnetic field direction resulting from the deliberate motion or movement of the portable device will now be described. Referring to FIG. 10, in a first step, a magnetic field-sensing device, e.g., a magnetic compass, a magnetometer and the like, can be installed or embedded in the portable device (STEP 11) in a manner that is well known in the art. In a second step, memory containing correlations between a discrete change in the magnetic field strength and a discrete pre-determined movements, motions or gestures and/or between a discrete change in the magnetic field direction and a discrete pre-determined movements, motions or gestures can be provided (STEP 12). In one aspect, each of the correlations can be uniquely associated with a discrete control or input operation, e.g., similar to a pointer. Consequently, when a detected change in magnetic field strength and/or a detected change in a direction of the magnetic field has been matched to one of the plurality of pre-determined correlations, the control or input function or operation associated with the pre-determined correlations will be executed automatically.

In a next step, the magnetic field-sensing device monitors and detects any changes in magnetic field strength and/or changes in magnetic field direction resulting from a deliberate motion or movement of the portable device (STEP 13). These changes in magnetic field strength/direction signal data can then be provided to the controller for comparison with the plurality of pre-determined correlations (STEP 15). Optionally, but advantageously, the signal data from the magnetic field-sensing device can be filtered (STEP 14) to remove undesirable noise before comparing the changes to the plurality of pre-determined correlations (STEP 15).

If the comparison of signal data with the plurality of pre-determined correlations stored in memory provides no match, then the magnetic field-sensing device continues to monitor and detect changes in magnetic field strength and/or direction of the portable device (STEP 13). However, if comparison of signal data with the plurality of pre-determined correlations provides a match, then the controller executes the function, operation, driver program, application, and the like that is associated with the matching pre-determined motion (STEP 16).

While the invention is described through the above-described exemplary embodiments, it will be understood by those of ordinary skill in the art that modifications to, and variations of, the illustrated embodiments can be made without departing from the inventive concepts disclosed herein. Accordingly, the invention should not be viewed as limited, except by the scope and spirit of the appended claims.

What is claimed is:

1. A system for controlling a portable device using magnetic-field sensing, the system comprising:
    a magnetic field-sensing device that is structured and arranged to sense changes in a magnetic field that accompany movement of the portable device;
    a data acquisition unit that receives data signals transmitted from the magnetic field-sensing device;
    memory for storing data that includes a plurality of pre-determined correlations between magnetic field changes resulting from movement of the portable device that are each uniquely associated with a discrete control operation; and
    a control unit that analyzes signals from the data acquisition unit; identifies characteristics of changes in a magnetic field that accompany movement of the portable device; compares the characteristics of changes in a magnetic field with the plurality of pre-determined correlations; and automatically executes the discrete control operation associated with the pre-determined correlations when the characteristics of changes in the magnetic field match the pre-determined correlations.

2. The system as recited in claim 1, wherein the magnetic-field sensing device is a magnetic compass or a magnetometer.

3. The system as recited in claim 1, wherein the magnetic field-sensing device is structured and arranged to detect changes in at least one of a magnetic field strength and a magnetic field direction.

4. A system for inputting data into a portable device using magnetic-field sensing, the system comprising:
    a magnetic field-sensing device that is structured and arranged to sense changes in a magnetic field that accompany movement of the portable device;
    a data acquisition unit that receives data signals transmitted from the magnetic field-sensing device;
    memory for storing data that includes a plurality of pre-determined correlations between magnetic field changes resulting from movement of the portable device that are each uniquely associated with a discrete control operation; and
    a control unit that analyzes signals from the data acquisition unit; identifies characteristics of changes in a magnetic field that accompany motion or movement of the portable device; compares the characteristics of changes in a magnetic field with the plurality of pre-determined correlations; and automatically executes the discrete control operation associated with the pre-determined correlations when the characteristics of changes in the magnetic field match the pre-determined correlations.

5. The system as recited in claim 4, wherein the magnetic-field sensing device is a magnetic compass or a magnetometer.

6. The system as recited in claim 4, wherein the magnetic field-sensing device is structured and arranged to detect changes in at least one of a magnetic field strength and a magnetic field direction.

7. A method for controlling a portable device using changes in at least one of a magnetic field strength and a magnetic field direction that accompany movement of the portable device to perform control operations, the method comprising:

installing or embedding a magnetic-field sensing device in the portable device;

providing a plurality of pre-determined correlations between changes in magnetic field properties due to movements and discrete control operations;

detecting changes in magnetic field properties due to movements of the portable device with the magnetic-field sensing device;

comparing the changes in magnetic field properties due to movements with the plurality of pre-determined correlations; and initiating the discrete control operation that is associated with the corresponding correlation so detected.

8. The method as recited in claim 7, wherein detecting change in magnetic field properties includes detecting at least one of changes in magnetic field strength and changes in magnetic field direction.

9. A method for inputting data into a portable device using movement of the portable device to perform control operations, the method comprising:

installing or embedding a magnetic-field sensing device in the portable device;

providing a plurality of pre-determined correlations between changes in magnetic field properties due to movements and discrete control operations;

detecting changes in magnetic field properties due to movements of the portable device with the magnetic-field sensing device;

comparing the changes in magnetic field properties due to movements with the plurality of pre-determined correlations; and initiating the discrete input operation that is associated with the corresponding correlation so detected.

10. The method as recited in claim 9, wherein detecting change in magnetic field properties includes detecting at least one of changes in magnetic field strength and changes in magnetic field direction.

* * * * *

UNITED STATES PATENT AND TRADEMARK OFFICE
CERTIFICATE OF CORRECTION

PATENT NO. : 8,139,030 B2  
APPLICATION NO. : 12/704896  
DATED : March 20, 2012  
INVENTOR(S) : Yang Zhao et al.

Page 1 of 1

It is certified that error appears in the above-identified patent and that said Letters Patent is hereby corrected as shown below:

Title Page, Item (75) "Shenzhen" should read --Shenzhen City--;

Title Page, Item (75) "Jiangsu" should read --Wuxi, Jiangsu--; and

Column 8, line 46, "rotated degrees," should read --rotated 90 degrees,--.

Signed and Sealed this  
Fifth Day of February, 2013

Teresa Stanek Rea  
*Acting Director of the United States Patent and Trademark Office*